(12) United States Patent
Sugimori

(10) Patent No.: US 12,431,893 B2
(45) Date of Patent: Sep. 30, 2025

(54) INFORMATION PROCESSING DEVICE AND INFORMATION PROCESSING METHOD

(71) Applicant: Sony Semiconductor Solutions Corporation, Kanagawa (JP)

(72) Inventor: Yasufumi Sugimori, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 47 days.

(21) Appl. No.: 18/570,886

(22) PCT Filed: Feb. 28, 2022

(86) PCT No.: PCT/JP2022/008259
§ 371 (c)(1),
(2) Date: Dec. 15, 2023

(87) PCT Pub. No.: WO2023/013118
PCT Pub. Date: Feb. 9, 2023

(65) Prior Publication Data
US 2024/0223183 A1 Jul. 4, 2024

(30) Foreign Application Priority Data
Aug. 5, 2021 (JP) ................. 2021-129018

(51) Int. Cl.
H03K 17/22 (2006.01)
H03K 17/30 (2006.01)

(52) U.S. Cl.
CPC ......... *H03K 17/223* (2013.01); *H03K 17/302* (2013.01); *H03K 2217/0036* (2013.01)

(58) Field of Classification Search
None
See application file for complete search history.

(56) References Cited

U.S. PATENT DOCUMENTS 7,965,113 B2 * 6/2011 Fuller ................. G06F 1/24
327/198
8,144,813 B2 * 3/2012 Nakamura ......... H04B 10/6933
375/345

FOREIGN PATENT DOCUMENTS

JP 2007034508 A 2/2007
JP 2012010163 A 1/2012
(Continued)

OTHER PUBLICATIONS

International Search Report (PCT/ISA/210), International Application No. PCT/JP2022/008259, dated May 17, 2022.

*Primary Examiner* — Jeffrey S Zweizig
(74) *Attorney, Agent, or Firm* — Michael Best & Friedrich LLP

(57) ABSTRACT

The present technology relates to an information processing device and an information processing method capable of reset with excellent robustness without a dedicated reset terminal being provided.

A built-in circuit is reset in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage. This technology can be applied to a TWS earphone and the like.

13 Claims, 9 Drawing Sheets

(56) References Cited

FOREIGN PATENT DOCUMENTS

| | | | |
|---|---|---|---|
| JP | 2016206906 A | 12/2016 | |
| JP | 2018067848 A | 4/2018 | |
| JP | 2018085848 A | 5/2018 | |

* cited by examiner

Fig. 3

|  | Unit | Min | Typ | Max |
|---|---|---|---|---|
| Vuartl | V | -0.1 | 0.0 | 0.1 |
| Vuarth | V | 1.62 | 1.8 | 1.92 |
| Vcharge | V | VCHG_UVL+0.1V | -- | VCHG_OVL-0.05V |
| Vreset | V | VCHG_OVL+0.01V | -- | 6.0V-0.01V |

INFORMATION PROCESSING DEVICE AND INFORMATION PROCESSING METHOD

TECHNICAL FIELD

The present technology relates to an information processing device and an information processing method, and particularly relates to an information processing device and an information processing method capable of reset with excellent robustness without a dedicated reset terminal being provided.

BACKGROUND ART

PTL 1 and PTL 2 disclose devices that monitor power supply voltage and switch processing depending on the power supply voltage.

CITATION LIST

Patent Literature

[PTL 1]
JP 2007-034508A
[PTL 2]
JP 2016-206906A

SUMMARY

Technical Problem

It may be difficult for a device such as a true wireless stereo (TWS) earphone to be provided with a dedicated terminal for inputting an external reset signal in order to reduce the size of the housing. For a case where a terminal for inputting a reset signal is also used as a terminal for other signals, it is desirable to improve robustness.

The present technology has been developed in view of such a situation, and enables reset with excellent robustness without a dedicated reset terminal being provided.

Solution to Problem

An information processing device according to the present technology is an information processing device including a reset processing unit that resets a built-in circuit in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage.

An information processing method according to the present technology is an information processing method including resetting, by a reset processing unit of an information processing device including the reset processing unit, a built-in circuit in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage.

In the information processing device and the information processing method according to the present technology, a built-in circuit is reset in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage.

BRIEF DESCRIPTION OF DRAWING

FIG. 3 is a diagram illustrating respective voltage ranges of a communication signal, a charging signal, and a high-voltage reset signal.

DESCRIPTION OF EMBODIMENT

Hereinafter, embodiments of the present technology will be described with reference to the drawings.

Embodiment of Electronic Control Device

Figure 1:
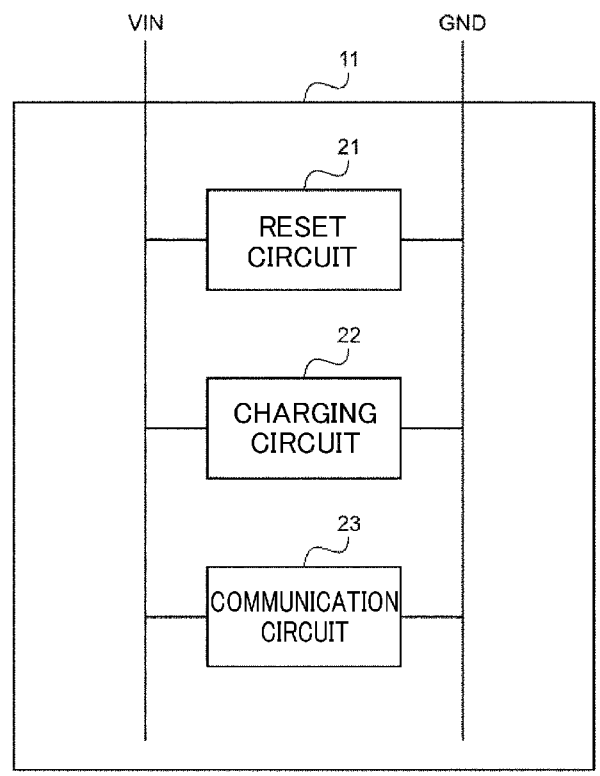
FIG. 1 is a block diagram illustrating a partial configuration of an information processing device including a reset circuit to which the present technology is applied.

FIG. 1 is a block diagram illustrating a partial configuration of an information processing device including a reset circuit to which the present technology is applied.

The information processing device 11 in FIG. 1 represents, for example, either a right ear or a left ear true wireless stereo (TWS) earphone. Although the information processing device 11 is not limited to a TWS earphone, a case will be described below in which the information processing device 11 is a TWS earphone. The information processing device 11 has two external terminals, a GND terminal and a VIN terminal, which are exposed on a housing. When the information processing device 11 is housed in a predetermined housing case, the GND terminal and the VIN terminal are connected to respective connection terminals provided in the housing case. The GND terminal is a terminal set to ground potential. The VIN terminal is a terminal through which a signal is input and output, and is also set to the voltage of that signal (referred to as a terminal signal VIN).

The information processing device 11 internally includes a reset circuit 21, a charging circuit 22, a communication circuit 23, and others. The reset circuit 21, the charging circuit 22, and the communication circuit 23 are electrically connected in parallel between the GND terminal and the VIN terminal. Note that a configuration may be provided in which two or more of the reset circuit 21, the charging circuit 22, and the communication circuit 23 are included in the information processing device 11 as components of a power management IC (PMIC).

The reset circuit 21 is a component part to which the present technology is applied. When the reset circuit 21 detects that a high-voltage reset signal is applied from the housing case through the GND terminal and the VIN terminal, the reset circuit 21 supplies to each circuit an internal reset signal that resets each circuit built into the information processing device 11, that is, an internal reset signal that transitions the state of the circuit to the initial state, and the like. Reset of a circuit can restore the circuit to a normal state when an unexpected situation occurs in the circuit state due to cosmic rays or the like. Note that the high-voltage reset signal may be generated by a predetermined operation of a user on an operation unit in the housing case, or may be generated in response to an operation and the like on a terminal such as a personal computer (PC) connected to the housing case through communication compliant with a predetermined communication standard such as Universal Serial Bus (USB).

When the charging circuit 22 detects that a charging signal is applied from the housing case through the GND terminal and the VIN terminal, the charging circuit 22 charges a built-in battery built into the information processing device 11.

The communication circuit 23 communicates with the communication circuit of the housing case by transmitting and receiving communication signals through the GND terminal and the VIN terminal.

The high-voltage reset signal detected by the reset circuit 21, the charging signal detected by the charging circuit 22, and the communication signal detected (transmitted/received) by the communication circuit 23 are determined (identified) by the voltage level of the terminal signal VIN input and output to the VIN terminal with respect to the GND terminal.

Figure 2:
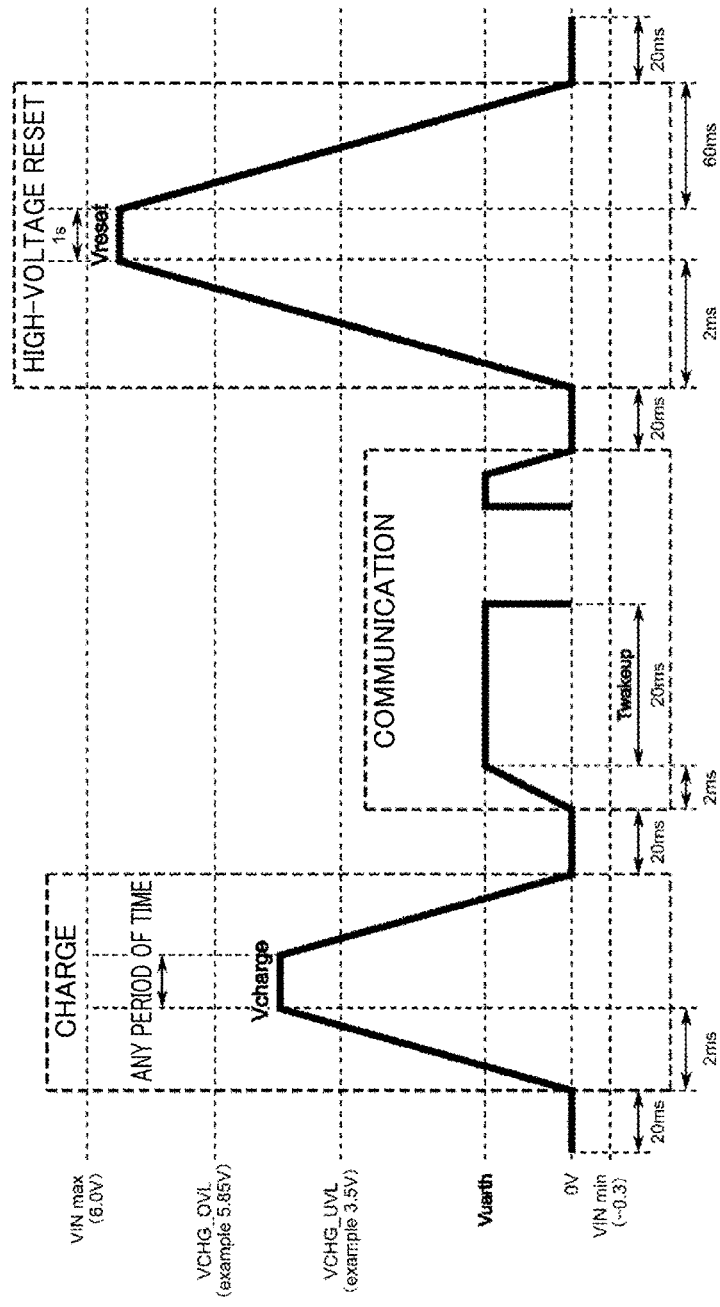
FIG. 2 is a diagram illustrating conditions for identifying a communication signal, a charging signal, and a high-voltage reset signal, which are input and output to a VIN terminal.

FIG. 2 is a diagram illustrating conditions for identifying a communication signal, a charging signal, and a high-voltage reset signal, which are input and output to the VIN terminal. In FIG. 2, the vertical axis represents the voltage of a terminal signal VIN input and output to the VIN terminal. A voltage VIN_min, a voltage Vuarth, a voltage VCHG_UVL, a voltage VCHG_OVL, and a voltage VIN_max, which are indicated on the vertical axis, indicate the following voltage levels.

The voltage VIN_min indicates a minimum value of the voltage of the terminal signal VIN, which can be input and output to the VIN terminal. The voltage VIN_min is, for example, −0.3 V. Note that the voltage 0 V indicates a voltage level having the same potential as the GND terminal. The voltage Vuarth indicates a reference value of the voltage of the terminal signal VIN, which is identified as a high-level signal of the communication signal. The reference value of the voltage Vuarth is, for example, 1.8 V.

The voltage VCHG_UVL indicates a lower limit value (a reference value that defines the lower limit value) of the voltage of the terminal signal VIN, which is identified as a charging signal Vcharge. The reference value of the voltage VCHG_UVL is set to, for example, 3.5 V as a default, but is changeable. The voltage VCHG_OVL is an upper limit value (a reference value that defines the upper limit value) of the voltage of the terminal signal VIN, which is identified as a charging signal Vcharge, and also a lower limit value (a reference value that defines the lower limit) of the voltage of the terminal signal VIN, which is identified as a high-voltage reset signal Vreset. The reference value of the voltage VCHG_OVL is set to, for example, 5.85 V as a default, but is changeable. The voltage VIN_max indicates a maximum voltage of the terminal signal VIN, which can be input and output to and from the VIN terminal. The voltage VIN_max is, for example, 6.0 V.

Note that the voltage VIN_min, the voltage Vuarth, the voltage VCHG_UVL, the voltage VCHG_OVL, and the voltage VIN_max are not limited to specific values.

When the voltage of the terminal signal VIN input to the VIN terminal is (voltage VCHG_UVL+0.1) V or higher and (voltage VCHG_OVL−0.05) V or lower, the terminal signal VIN is detected by the charging circuit 22 as a charging signal Vcharge. In this case, the charging circuit 22 charges the internal battery built into the information processing device 11 by using the power of the charging signal Vcharge. When the voltage of the terminal signal VIN input to the VIN terminal drops below (voltage VCHG_UVL+0.1) V, the terminal signal VIN is no longer detected as a charging signal Vcharge, and accordingly, the charging circuit 22 stops charging the built-in battery. Note that a period of time during which the charging signal Vcharge is continuously input is not particularly determined because it depends on the state of charge (remaining capacity) of the built-in battery.

When the voltage of the terminal signal VIN input to the VIN terminal is 1.62 V or higher and 1.92 V or lower, the terminal signal VIN is detected by the communication circuit 23 as the high-level signal Vuarth of the communication signal. When the voltage of the terminal signal VIN input to the VIN terminal is (−0.1) V or higher and (+0.1) V or lower, the terminal signal VIN is detected by the communication circuit 23 as a low-level signal Vuartl of the communication signal. The communication circuit 23 receives a predetermined command, data, and the like from the housing case through a communication signal composed of the low-level signal Vuartl and the high-level signal Vuarth. The communication circuit 23 outputs from the VIN terminal a communication signal having the same voltage level as the terminal signal VIN input to the VIN terminal to transmit a predetermined command and data to the housing case. Communication signals transmitted and received between the communication circuit 23 and the housing case through the VIN terminal allow the communication circuit 23 to receive data and the like for updating the operating program of the information processing device 11 from the housing case. The communication circuit 23 can transmit data such as the remaining amount of the built-in battery to the housing case.

When the voltage of the terminal signal VIN input to the VIN terminal is (voltage VCHG_OVL+0.01) or higher and (voltage VIN_max−0.01) V or lower, the terminal signal VIN is detected by the reset circuit 21 as the high-voltage reset signal Vreset. Note that the high-voltage reset signal Vreset is input from the housing case so that its peak voltage is kept for, for example, one second or more. In this case, the reset circuit 21 resets circuits in a circuit domain (first domain) excluding a circuit domain (second domain) that is part of the reset circuit 21, and circuits (circuit modules) built into the information processing device 11 other than the reset circuit 21. The circuits other than the reset circuit 21 (circuits to be reset) may be regarded as circuits included in the first domain. Resetting a circuit means transitioning the circuit state to the initial state to transition data held by each circuit to an initial value. When the terminal signal VIN input to the VIN terminal is detected by the reset circuit 21 as the high-voltage reset signal Vreset and then the voltage of the terminal signal IN is reduced to a predetermined comparison voltage Ref (e.g., 2.5 V) or lower that is smaller (lower) than (voltage VCHG_OVL+0.01) V, the reset circuit 21 cancels (stops) the reset of the circuits in the first domain of the reset circuit 21 and the circuits other than the reset circuit 21 of the information processing device 11, and resets the circuits in the second domain of the reset circuit 21. The second domain includes, for example, a circuit (holding circuit) for holding data indicating that the high-voltage reset signal Vreset has been detected, and a circuit that detects whether or not the voltage of the terminal signal VIN input from the VIN terminal is the comparison voltage Ref or lower. Note that the voltage VCHG_OVL for determining that a signal is the high-voltage reset signal Vreset is not limited to being larger (higher) than the voltage range of the charging signal Vcharge, but may be smaller (lower). The voltage VCHG_OVL is not limited to being larger (higher) than the voltage range of the communication signal. In the present embodiment, a case is given in which the comparison voltage Ref is, for example, 2.5 V, which is smaller (lower) than the voltage range of the charging signal Vcharge. However, the comparison voltage Ref may be changeable and is not limited to being smaller than the voltage range of the charging signal Vcharge.

FIG. 3 is a diagram illustrating the respective voltage ranges of the communication signal (the low-level Vuart1 and the high-level signal Vuarth), the charging signal Vcharge, and the high-voltage reset signal Vreset.

The low-level signal Vuart1 of the communication signal is a signal in a voltage range of −0.1 V or higher and 0.1 V or lower with respect to 0.0 V as a reference value. The high-level signal Vuarth of the communication signal is a signal in a voltage range of 1.62 V or higher and 1.92 V or lower with respect to 1.8 V as a reference.

The charging signal Vcharge is a signal in a voltage range of (voltage VCHG_UVL+0.1) V or higher and (voltage VCHG_OVL−0.05) V or lower. The voltage VCHG_UVL is changeable, and is, for example, 3.5 V by a default.

The high-voltage reset signal Vreset is a signal in a voltage range of (voltage VCHG_OVL+0.01) V or higher and (6.0−0.01) V or lower. The voltage VCHG_OVL is changeable, and is, for example, 5.85 V by a default.

Note that the present technology relates to the reset circuit 21, and the circuits other than the reset circuit 21 included in the information processing device 11 are not limited to the charging circuit 22 and the communication circuit 23, and may be circuits that perform any processing.

First Embodiment of Reset Circuit 21

Figure 4:
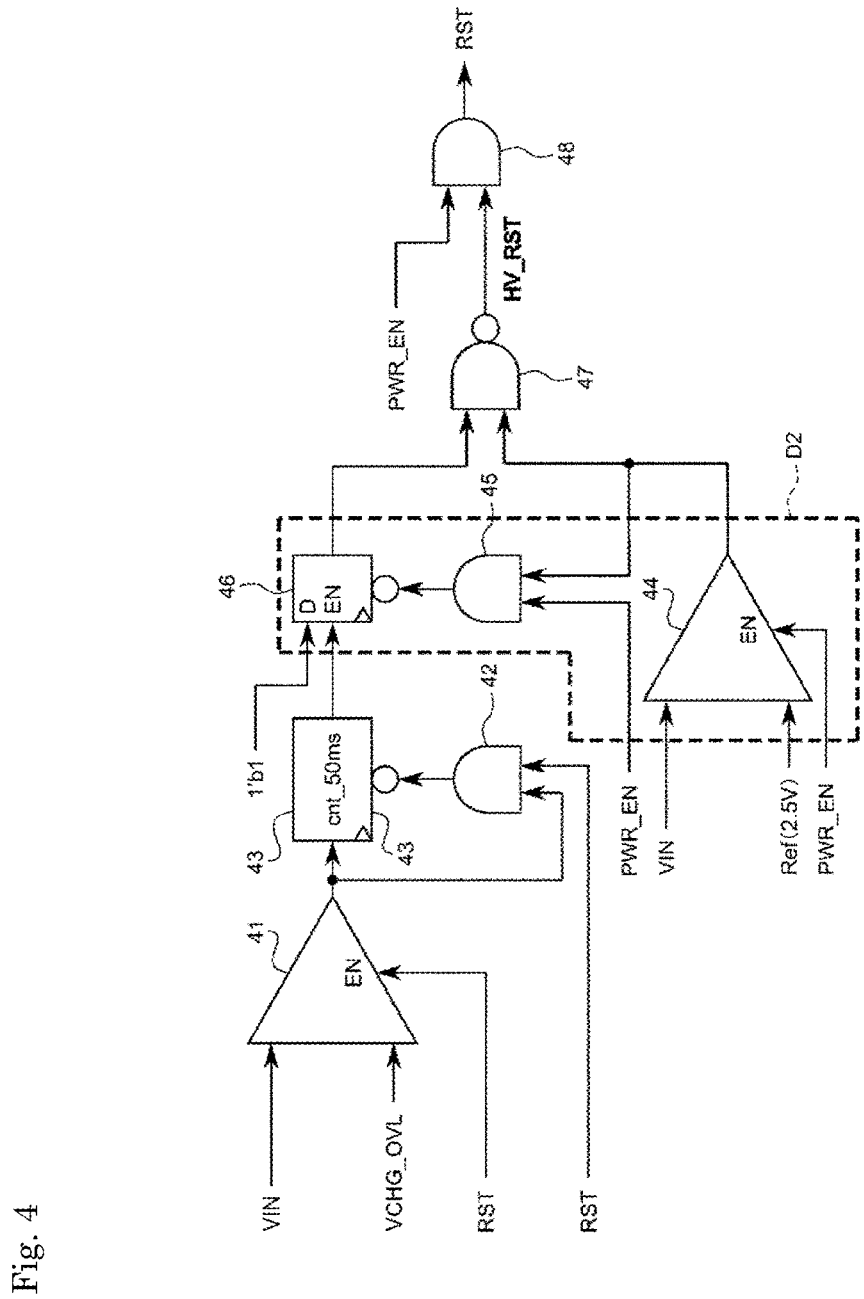
FIG. 4 is a block diagram illustrating a configuration of a first embodiment of the reset circuit of FIG. 1.
Figure 5:
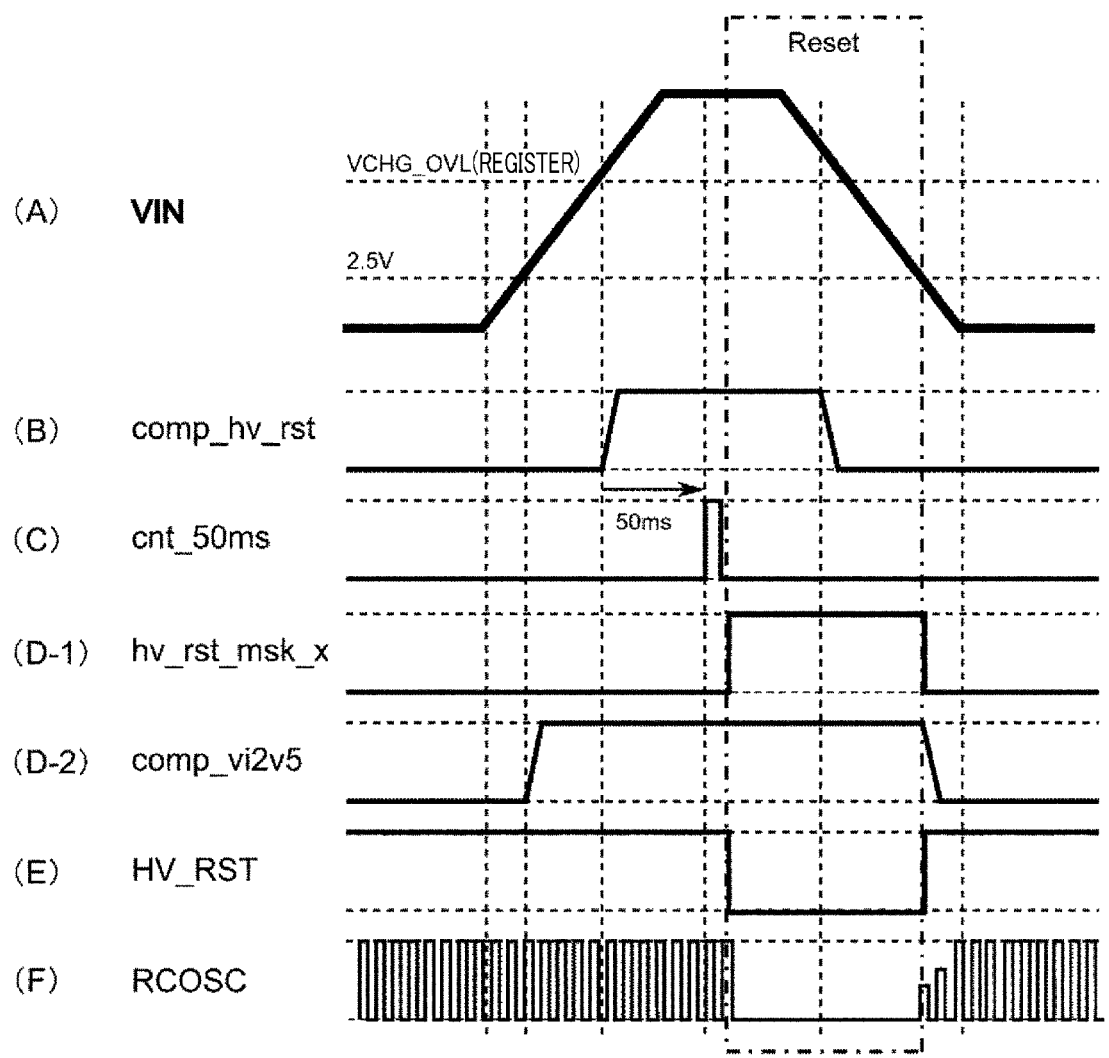
FIG. 5 is a diagram representing transitions of output signals of parts of the reset circuit of FIG. 4.

FIG. 4 is a block diagram illustrating a configuration of the first embodiment of the reset circuit 21. FIG. 5 is a diagram representing transitions of output signals of parts of the reset circuit 21 of FIG. 4. For explaining the reset circuit 21, reference will be made to FIG. 5 as appropriate. Note that the high-voltage reset signal Vreset is a signal in a voltage range of (voltage VCHG_OVL) V or higher and 6.0 V or lower. In the present embodiment, the upper limit voltage of the high-voltage reset signal Vreset is set to 6.0 V, which is an upper limit voltage within a range to be guaranteed by the information processing device 11, but it may be a voltage lower than 6.0 V and is not limited to 6.0 V. The upper limit voltage of the high-voltage reset signal Vreset may be a voltage higher than 6.0 V if the upper limit voltage within the range to be guaranteed by the information processing device 11 is higher than 6.0 V. The same applies to second and third embodiments of the reset circuit 21, which will be described below.

The reset circuit 21 includes a comparator circuit 41, an AND circuit 42, a counter circuit 43, a comparator circuit 44, an AND circuit 45, a D flip-flop circuit 46, a NAND circuit 47, and an AND circuit 48.

The comparator circuit 41 has first to third input terminals. The terminal signal VIN input from the VIN terminal is input to the first input terminal. A signal of the constant voltage VCHG_OVL (referred to as the voltage signal VCHG_OVL) is input to the second input terminal. The voltage signal VCHG_OVL (5.85 V) is generated by a power supply circuit (not illustrated) using power from the built-in battery of the information processing device 11. The power supply circuit includes a register (storage unit) that stores a set value (voltage value) for the voltage signal VCHG_OVL. By changing the set value stored in the register, the value of the voltage signal VCHG_OVL is changed. The set value for the voltage signal VCHG_OVL in the register can be changed by a command or data from the housing case through communication with the housing case by the communication circuit 23. Since the housing case is connected to a terminal such as a personal computer (PC) through communication compliant with a predetermined communication standard such as USB, the user or the like may specify, from the terminal to the housing case, a desired value as the set value for the voltage signal VCHG_OVL, or the set value for the voltage signal VCHG_OVL may be included in data for updating the information processing device 11 to be transmitted from the terminal to the housing case.

The comparator circuit 41 compares the voltages of the terminal signal VIN input to the first input terminal and the voltage signal VCHG_OVL input to the second input terminal, and outputs a low-level voltage signal (referred to as an L signal) or a high-level voltage signal (referred to as an H signal) depending on the result of comparison. The L signal is, for example, 0.0 V, and the H signal is, for example, 5.0 V. In FIG. 5, (A) illustrates an example of the transition of the terminal signal VIN, and in FIG. 5, (B) illustrates an example of the transition of an output signal comp_hv_rst of the comparator circuit 41. During a period in which the voltage of the terminal signal VIN is lower than the voltage signal VCHG_OVL in (A) of FIG. 5, the comparator circuit 41 outputs an L signal as the output signal comp_hv_rst in (B) of FIG. 5. During a period in which the voltage of the terminal signal VIN is the voltage signal VCHG_OVL or higher in (A) of FIG. 5, the comparator circuit 41 outputs an H signal as the output signal comp_hv_rst in (B) of FIG. 5.

An output signal RST output from the AND circuit 48 is input to the third input terminal of the comparator circuit 41. The AND circuit 48 outputs an output signal RST that transitions in the same way as an output signal HV_RST in (B) of FIG. 5, as will be described later. In other words, in order to reset the first domain, which is a circuit domain other than the second domain D2 of the reset circuit 21, the AND circuit 48 outputs an L signal as the output signal RST, and in order to not reset the first domain, the AND circuit 48 outputs an H signal as the output signal RST (described later). In the comparator circuit 41, no reset is performed during a period in which an H signal is input as the output signal RST from the AND circuit 48 to the third input terminal, and the reset is performed during a period in which an L signal is input. When the comparator circuit 41 is reset, the comparator circuit 41 outputs an L signal as the output signal comp_hv_rst. As described above, in (A) and (B) of FIG. 5, since an H signal is output from the AND circuit 48 as the output signal RST immediately after the voltage of the terminal signal VIN becomes the voltage signal VCHG_OVL or higher, the comparator circuit 41 outputs an H signal as the output signal comp_hv_rst. When a predetermined period of time elapses after the H signal is output as the output signal comp_hv_rst, the state changes to a state where an L signal is output from the AND circuit 48 as the output signal RST, and accordingly, the comparator circuit 41 changes the output signal comp_hv_rst from an H signal to an L signal. Specifically, when the output signal RST from the AND circuit 48 input to the third input terminal of the comparator circuit 41 changes from an H signal to an L signal (see (B) of FIG. 5), the comparator circuit 41 starts a reset process, and when the reset process is completed after a predetermined period of time has elapsed, the output signal comp_hv_rst from the comparator circuit 41 is changed from an H signal to an L signal.

The AND circuit 42 has a first input terminal and a second input terminal. The output signal comp_hv_rst from the comparator circuit 41 is input to the first input terminal. The output signal RST from the AND circuit 48 is input to the second input terminal. The AND circuit 42 changes the output signal from the output terminal to an L signal or an H signal according to a logical AND of the output signal comp_hv_rst input to the first input terminal and the output signal RST input to the second input terminal (a logical AND of positive logic with 1 for an H voltage and 0 for an L voltage). Specifically, the AND circuit 42 outputs an H signal as the output signal in response to only an input of an H signal to both the first input terminal and the second input terminal, and otherwise outputs an L signal as the output signal. For example, in (B) of FIG. 5, since an H signal is input to both the first input terminal and the second input terminal immediately after the output signal comp_hv_rst output by the comparator circuit 41 is changed from an L signal to an H signal, the AND circuit 42 outputs an H signal.

The counter circuit 43 has a first input terminal and a second input terminal. The output signal comp_hv_rst from the comparator circuit 41 is input to the first input terminal. The output signal from the AND circuit 42 is input to the second input terminal via a NOT gate. When an H signal is input as the output signal comp_hv_rst to the first input terminal, the counter circuit 43 measures 50 ms (milliseconds) from that input. However, the time to be measured is not limited to 50 ms. The counter circuit 43 outputs an H signal (a single pulse) as an output signal cnt_50 ms when 50 ms has elapsed since the start of measurement. The counter circuit 43 outputs an L signal as an output signal cnt_50 ms during a period in which no measurement is performed and a period before 50 ms has elapsed since the start of measurement. In FIG. 5, (C) illustrates an example of the transition of the output signal cnt_50 ms. In (C) of FIG. 5, when an H signal is input as the output signal comp_hv_rst from the comparator circuit 41 to the first input terminal (see (B) of FIG. 5), the counter circuit 43 measures 50 ms from that input. When 50 ms from the start of measurement has been measured, the counter circuit 43 outputs an H signal (a single pulse).

A case is now assumed in which the output signal comp_hv_rst from the comparator circuit 41 changes from an H signal to an L signal before the counter circuit 43 measures 50 ms. In this case, an L signal is input to the first input terminal of the AND circuit 42, and accordingly, the AND circuit 42 outputs an L signal as the output signal. When the L signal is output from the AND circuit 42, an H signal is input to the second input terminal of the counter circuit 43 via the NOT gate (the L signal is input to the NOT gate). Note that although the counter circuit 43 presented herein is a circuit that is reset by negative logic for reset in response to an input of an L signal to the NOT gate at the second input terminal, it is a circuit that is reset by positive logic in response to an input, into the second input terminal, of a signal which is an inversion of an H signal or an L signal after passing through the NOT gate. For the D flip-flop circuit 46 and other circuits, which will be described later, if a NOT gate is given to an input terminal for receiving a reset signal (a signal that enables reset), they will be described as being circuits that are also reset by positive logic in response to an H signal after passing through the NOT gate. The counter circuit 43 is reset in response to an input of an H signal to the second input terminal via the NOT gate to which an L signal is input, and then ends the measurement. Therefore, if an H signal is input to the second input terminal before 50 ms has elapsed since the start of measurement, the counter circuit 43 does not output an H signal (a single pulse) even when 50 ms has elapsed since the start of measurement. When an H signal (a single pulse) is not output from the counter circuit 43, the reset circuit 21 does not perform the reset as described later. Therefore, when a signal with an unexpected voltage higher than the voltage signal VCHG_OVL such as noise or surge pulse is input as the terminal signal VIN, and the voltage of that signal is not kept for 50 ms or more, the output signal comp_hv_rst from the comparator circuit 41 is changed from an H signal to an L signal before the counter circuit 43 has measured 50 ms. Thus, reset due to noise or the like is not performed, and as a result, the reset circuit 21 has excellent robustness. Note that 50 ms, which is the time to be measured by the counter circuit 43, is just an example, and a time other than 50 ms may be used.

The comparator circuit 44 compares the voltage of the terminal signal VIN input to the first input terminal and the voltage of the comparison signal Ref input to the second input terminal, and outputs an L signal or an H signal as an output signal comp_vi2v5 depending on the result of comparison. In FIG. 5, (D-2) illustrates an example of the transition of the output signal comp_vi2v5. During a period in which the voltage of the terminal signal VIN is lower than the comparison signal Ref (2.5 V) (see (A) of FIG. 5), the comparator circuit 44 outputs an L signal as the output signal comp_vi2v5 in (D-2) of FIG. 5. During a period in which the voltage of the terminal signal VIN is the comparison signal Ref (2.5V) or higher, the comparator circuit 44 outputs an H signal as the output signal comp_vi2v5. Note that the voltage of the comparison signal Ref (2.5 V) is generated by a power supply circuit (not illustrated), and may be changeable like the voltage signal VCHG_OVL.

A power supply signal PWR_EN is input to the third input terminal of the comparator circuit 44. The power supply signal PWR_EN is generated by a power supply circuit (not illustrated) using power from the built-in battery. The power supply signal PWR_EN is an H signal when power is supplied to the reset circuit 21 from the power supply circuit, and is an L signal when power is not supplied.

The AND circuit 45 has a first input terminal and a second input terminal. The power supply signal PWR_EN is input to the first input terminal. The output signal comp_vi2v5 from the comparator circuit 44 is input to the second input terminal. The AND circuit 45 changes the output signal from the output terminal to an L signal or an H signal according to a logical AND of the power supply signal PWR_EN input to the first input terminal and the output signal comp_vi2v5 input to the second input terminal (a logical AND of positive logic with 1 for an H voltage and 0 for an L voltage). Specifically, the AND circuit 45 outputs an H signal as the output signal in response to only an input of an H signal to both the first input terminal and the second input terminal, and otherwise outputs an L signal as the output signal. For example, in (D-2) of FIG. 5, since an L signal is input to the second input terminal during a period when the output signal comp_vi2v5 output by the comparator circuit 44 is an L signal, the AND circuit 45 outputs an L signal as the output signal. When the output signal comp_vi2v5 is changed from an L signal to an H signal, an H signal is input to both the first input terminal and the second input terminal, and accordingly, the AND circuit 45 outputs an H signal.

The D flip-flop circuit 46 is a D flip-flop with enable, and has first to third input terminals. An H signal is input as a voltage signal 1'b1 to the first input terminal (D terminal). The voltage signal 1'b1 is generated by a power supply circuit (not illustrated) using power from the built-in battery of the information processing device 11. The output signal cnt_50 ms output from the counter circuit 43 is input to the second input terminal (EN terminal). The output signal from the AND circuit 45 is input to the third input terminal via a NOT gate.

When an H signal is input as the output signal cnt_50 ms to the second input terminal, the D flip-flop circuit 46 latches the H signal input at that time as the voltage signal 1'b1 to the first input terminal, and outputs the H signal as an output signal hv_rst_msk_x. In FIG. 5, (D-1) illustrates an example of the transition of the output signal hv_rst_msk_x. In (D-1) of FIG. 5, when an H signal (a single pulse) is input to the second input terminal as the output signal cnt_50 ms (see (C) of FIG. 5), the D flip-flop circuit 46 outputs an H signal as the output signal hv_rst_msk_x. After that, the D flip-flop circuit 46 continues to output the H signal as the output signal hv_rst_msk_x even after an L signal is input as the output signal cnt_50 ms to the second input terminal.

A case is now assumed in which the voltage of the terminal signal VIN changes from a voltage higher than the comparison signal Ref to a voltage lower than the comparison signal Ref. In this case, the comparator circuit 44 changes the output signal comp_vi2v5 output from the output terminal from an H signal to an L signal. When an L signal is output as the output signal comp_vi2v5 from the output terminal of the comparator circuit 44, the AND circuit 45 outputs an L signal as the output signal. When the L signal is output from the AND circuit 45, an H signal is input to the third input terminal of the D flip-flop circuit 46 via the NOT gate. When the H signal is input to the third input terminal, the D flip-flop circuit 46 is reset and changes the output signal hv_rst_msk_x from an H signal to an L signal. Specifically, the D flip-flop circuit 46 outputs an H signal as the output signal hv_rst_msk_x after a predetermined time (50 ms) has elapsed since the voltage of the terminal signal VIN became the voltage signal VCHG_OVL or higher. After that, the D flip-flop circuit 46 holds the H signal output as the output signal hv_rst_msk_x until the voltage of the terminal signal VIN becomes the comparison signal Ref or lower. During a period in which the D flip-flop circuit 46 is outputting an H signal, the AND circuit 48 outputs an L signal as the output signal RST as described later, and accordingly, the circuits in the first domain other than the second domain D2 in the reset circuit 21, and others are reset. During this period, in order to hold the output of the H signal as a circuit for holding data indicating that the high-voltage reset signal Vreset has been detected, the D flip-flop circuit 46 included in the second domain is not reset. After the voltage of the terminal signal VIN becomes a voltage lower than the comparison signal Ref and accordingly, the reset of the circuits in the first domain and others is canceled (stopped), the D flip-flop circuit 46 is reset as a circuit in the circuit domain which is the second domain D2.

The NAND circuit 47 has a first input terminal and a second input terminal. The output signal hv_rst_msk_x from the D flip-flop circuit 46 is input to the first input terminal. The output signal comp_vi2v5 from the comparator circuit 44 is input to the second input terminal. The NAND circuit 47 outputs an L signal or an H signal as the output signal HV_RST according to a logical NAND (a logical NAND of positive logic with 1 for an H voltage and 0 for an L voltage) of the output signal hv_rst_msk_x input to the first input terminal and the output signal comp_vi2v5 input to the second input terminal. The NAND circuit 47 outputs an L signal as the output signal HV_RST in response to only an H signal of both the output signal hv_rst_msk_x and the output signal comp_vi2v5. The NAND circuit 47 outputs an H signal as the output signal HV_RST in response to an L signal of at least one of the output signal hv_rst_msk_x and the output signal comp_vi2v5. In FIG. 5, (E) illustrates an example of the transition of the output signal HV_RST. In (E) of FIG. 5, the NAND circuit 47 outputs an L signal as the output signal HV_RST only during a period in which the output signal hv_rst_msk_x is an L signal (see (D-1) of FIG. 5) and a period in which the output signal comp_vi2v5 is an L signal (see (D-2) of FIG. 5), and outputs an H signal during other periods. Specifically, immediately after 50 ms has elapsed since the voltage of the terminal signal VIN became the voltage signal VCHG_OVL or higher and accordingly, an H signal (a single pulse) is output as the output signal cnt_50 ms, the NAND circuit 47 outputs an L signal as the output signal HV_RST. After that, when the voltage of the terminal signal VIN becomes the comparison signal Ref (2.5 V) or lower and accordingly, the output signal hv_rst_msk_x and the output signal comp_vi2v5 change from an L signal to an H signal, the NAND circuit 47 outputs an H signal as the output signal HV_RST. Note that instead of the NAND circuit 47, a NOT circuit may be used that changes the output signal hv_rst_msk_x between an L signal and an H signal to output the resulting signal as the output signal HV_RST.

The AND circuit 48 has a first input terminal and a second input terminal. An H signal is input to the first input terminal as the power supply signal PWR_EN. The output signal HV_RST from the NAND circuit 47 is input to the second input terminal. The AND circuit 48 outputs an L signal or an H signal as the output signal RST according to a logical AND (a logical AND of positive logic with 1 for an H voltage and 0 for an L voltage) of the power supply signal PWR_EN input to the first input terminal and the output signal HV_RST input to the second input terminal. Specifically, the AND circuit 48 outputs an H signal as the output signal RST in response to an input of an H signal as the output signal HV_RST to the second input terminal. The AND circuit 48 outputs an L signal as the output signal RST in response to an input of an L signal as the output signal HV_RST to the second input terminal. Therefore, during a period in which an H signal is input as the power supply signal PWR_EN to the first input terminal of the AND circuit 48, the AND circuit 48 outputs the output signal RST that transitions in the same way as the output signal HV_RST of the NAND circuit 47. Although the transition of the output signal RST is omitted in FIG. 5, the transition of the output signal HV_RST in (D-2) of FIG. 5 represents the transition of the output signal RST.

The output signal RST output from the AND circuit 48 is applied as an internal reset signal to each circuit in the first domain of the reset circuit 21 and to the circuits other than the reset circuit 21 in the information processing device 11. Specifically, the output signal RST output from the AND circuit 48 is input to the third input terminal of the comparator circuit 41, and the comparator circuit 41 is reset when the output signal RST becomes an L signal. The output signal RST output from the AND circuit 48 is input to the second input terminal of the counter circuit 43 via the AND circuit 42, and the comparator circuit 41 is reset when the output signal RST becomes an L signal.

When the terminal signal VIN becomes the comparison signal Ref (2.5 V) or lower and the output signal comp_vi2v5 from the comparator circuit 44 changes from an H signal to an L signal, an H signal is input to the third input terminal of the D flip-flop circuit 46 in the second domain D2 of the reset circuit 21, and accordingly, the D flip-flop circuit 46 is reset.

Here, the power supply signal PWR_EN may be, for example, a reset signal input from a reset terminal of an IC chip such as a PMIC including the reset circuit 21. It is now assumed that an L signal is input as a reset signal to the reset terminal of the IC chip in order to reset the circuits in the IC chip, and otherwise, an H signal is input as a reset signal. In this case, the reset circuit 21 of FIG. 4 is installed on a signal line through which the reset signal input from the reset terminal of the IC chip is transmitted, and the reset signal is used as the power supply signal PWR_EN. According to this, the reset circuit 21 of FIG. 4 can be added without substantially changing the circuit configuration for reset of the existing IC chip, and the reset circuit 21 can be easily included in an existing IC chip. The AND circuit 48 outputs an L signal as the output signal RST in response to not only an input of an L signal as the output signal HV_RST from the NAND circuit 47 but also an input of an L signal of the reset signal as the power supply signal PWR_EN from the reset terminal of the IC chip. Therefore, in addition to a case where the reset is performed based on the high-voltage reset signal Vreset input to the VIN terminal of the reset circuit 21 (IC chip), reset can be performed based on the reset signal (an L signal) input from the reset terminal of the IC chip. For example, a method of reset can be used as is in an IC chip including the reset circuit 21, in which when a predetermined switch of the information processing device 11 is pressed for a long time, the reset signal (an L signal) is input to the reset terminal of the IC chip and accordingly, the IC chip is reset. However, a case may be given such that an H signal generated by the power supply circuit is always input to the reset terminal of the IC chip so that the power supply signal PWR_EN is a constant voltage (an H signal).

Note that in FIG. 5, (F) represents a clock signal (a clock signal RCOSC) output from an RCOSC circuit not illustrated in FIG. 4 and supplied to the counter circuit 43 and the D flip-flop circuit 46. The RCOSC circuit is a circuit in the first domain. In (F) of FIG. 5, the RCOSC circuit stops outputting the clock signal RCOSC during a period in which the output signal HV_RST from the NAND circuit 47 (i.e., the output signal RST from the AND circuit 48) is an L signal. The RCOSC circuit outputs the clock signal RCOSC during a period in which the output signal HV_RST from the NAND circuit 47 is an H signal. Specifically, when the AND circuit 48 outputs an L signal as the output signal RST immediately after 50 ms has elapsed since the voltage of the terminal signal VIN became the voltage signal VCHG_OVL or higher and accordingly, an H signal (a single pulse) is output as the output signal cnt_50 ms, the RCOSC circuit is reset and the output of the clock signal RCOSC is stopped. After that, when the terminal signal VIN becomes the comparison signal Ref (2.5 V) or lower and accordingly, the output signal HV_RST changes from an L signal to an H signal, the reset of the RCOSC circuit is canceled and the output of the clock signal RCOSC from the RCOSC circuit is resumed. Even during a period in which the output of the clock signal RCOSC is stopped, the D flip-flop circuit 46 outputs an H signal as the output signal hv_rst_msk_x, so that the AND circuit 48 continues to output the L signal as the output signal RST until the reset of the first domain is successfully completed.

According to the first embodiment of the reset circuit 21 described above, the reset is performed in a period from a point of time when the voltage of the terminal signal VIN is detected to be the voltage signal VCHG_OVL or higher to a point of time when the voltage of the terminal signal VIN is detected to be the comparison signal Ref or lower, which is a voltage lower than the voltage signal VCHG_OVL. Therefore, even if the voltage of the high-voltage reset signal Vreset is unstable, the reset is difficult to be canceled and has excellent robustness. Unnecessary operations for detecting a voltage after the cancellation of reset are also avoided. Since the reset is performed after a certain period of time has elapsed from the point of time when the voltage of the terminal signal VIN was detected to be the voltage signal VCHG_OVL or higher, unintentional resets due to noise, surge pulses, and the like are prevented, and robustness is improved. Since the voltage value of the voltage signal VCHG_OVL and the voltage value of the comparison signal Ref can be changed, it is possible to cope with differences in charging voltage depending on the battery type. By changing the timing of resetting the circuits in each of the two domains into which a domain to be reset is divided, all the circuits can be reset. Note that the comparator circuit 44 is not reset by the output signal RST (the high-voltage reset signal Vreset), but can be reset by changing the power supply signal PWR_EN from an H signal to an L signal. The power supply signal PWR_EN may be changed to an L signal at a predetermined timing, such as when the information processing device 11 is powered off. By making the comparator circuit 44 a circuit that does not have a function of holding (storing) a logical value, it is possible to eliminate the need for reset. If the comparator circuit 44 is an analog circuit that does not have a function of holding a logical value, the power supply signal PWR_EN input to the third input terminal as illustrated in FIG. 4 may an enable signal with an H signal to operate the comparator circuit 44 and a disable signal with an L signal to stop the function of the comparator circuit 44.

Second Embodiment of Reset Circuit 21

Figure 6:
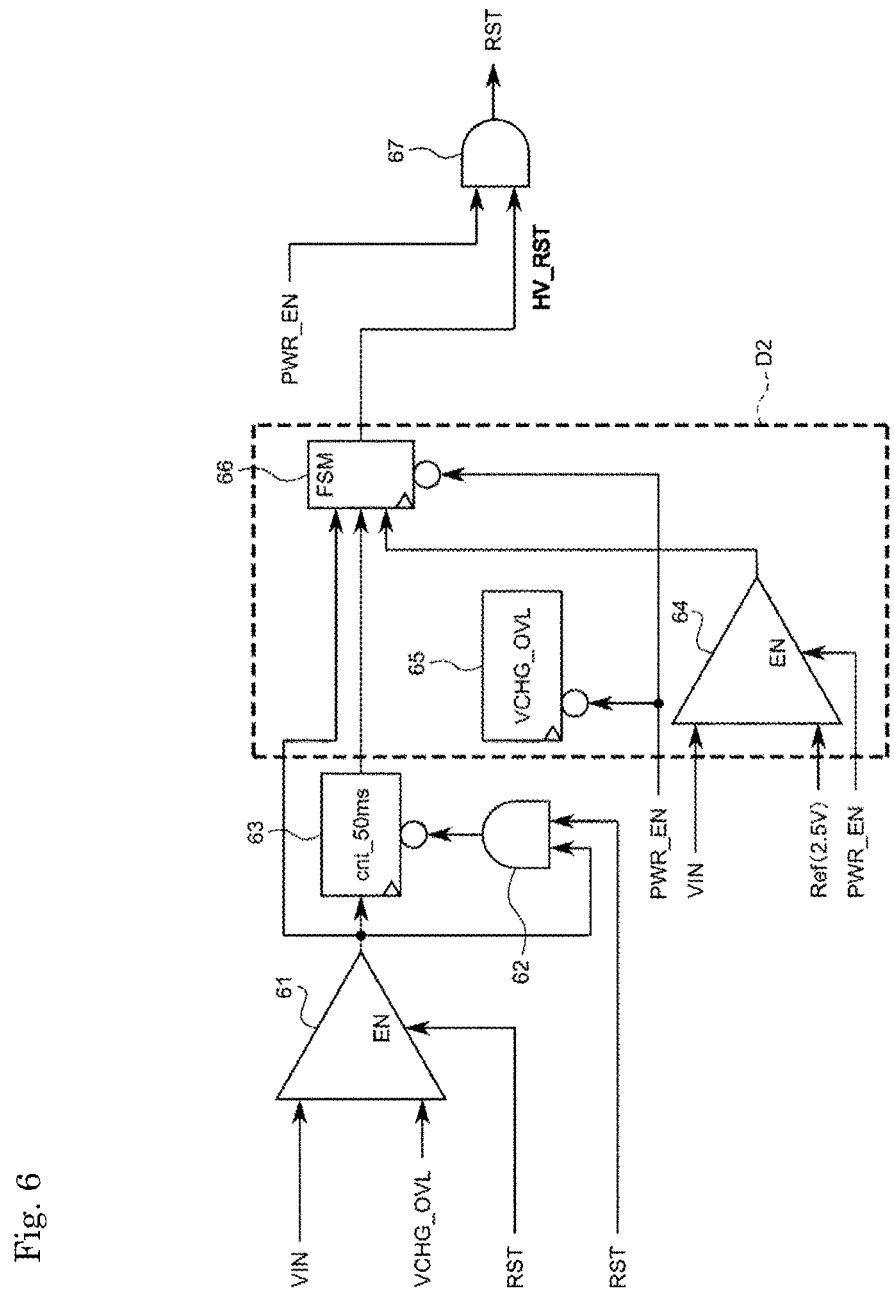
FIG. 6 is a block diagram illustrating a configuration of a second embodiment of the reset circuit of FIG. 1.
Figure 7:
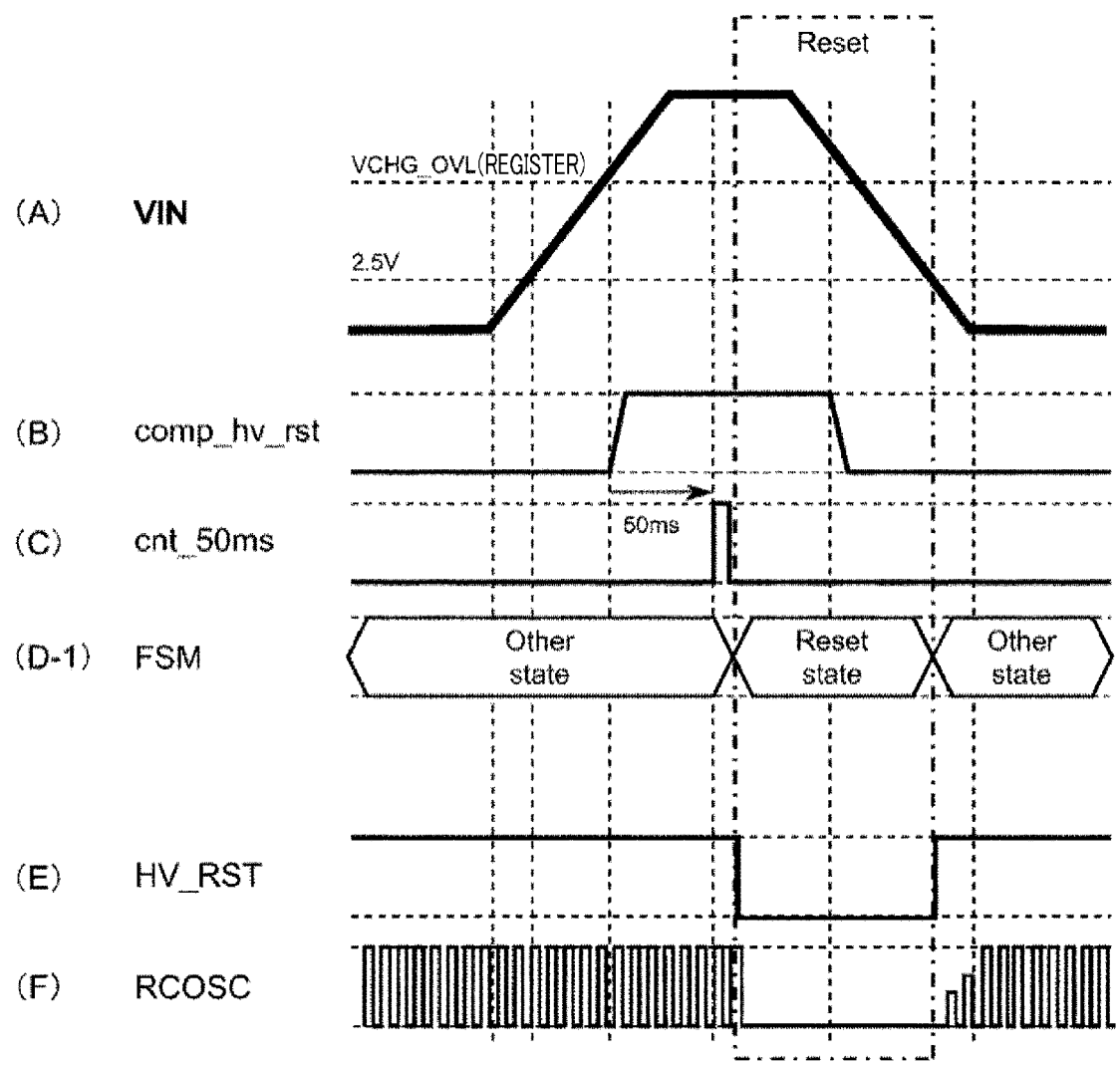
FIG. 7 is a diagram representing transitions of output signals of parts of the reset circuit of FIG. 6.

FIG. 6 is a block diagram illustrating a configuration of the second embodiment of the reset circuit 21 of FIG. 1. FIG. 7 is a diagram representing transitions of output signals of parts of the reset circuit 21 of FIG. 6. For explaining the reset circuit 21 of FIG. 6, reference will be made to FIG. 7 as appropriate. Note that the high-voltage reset signal Vreset is a signal in a voltage range of (voltage signal VCHG_OVL) V or higher and 6.0 V or lower.

In FIG. 6, the reset circuit 21 includes a comparator circuit 61, an AND circuit 62, a counter circuit 63, a comparator circuit 64, a voltage generator circuit 65, an FSM circuit 66, and an AND circuit 67. The comparator circuit 61, the AND circuit 62, the counter circuit 63, the comparator circuit 64, and the AND circuit 67 in the reset circuit 21 of FIG. 6 correspond to the comparator circuit 41, the AND circuit 42, the counter circuit 43, the comparator circuit 44, and the AND circuit 48 in FIG. 4, respectively, and thus, the detailed description thereof will be omitted.

The voltage generator circuit 65 in FIG. 6 includes a register that stores a set value for a voltage signal VCHG_OVL, and generates the voltage signal VCHG_OVL to be input to the second input terminal of the comparator circuit 61. The voltage generator circuit 65 has a first input terminal. A power supply signal PWR_EN that is the same as that in the first embodiment of FIG. 4 is input to the first input terminal via a NOT gate.

The FSM circuit 66 is a circuit in the second domain D2 that functions as a circuit for holding data indicating that the high-voltage reset signal Vreset has been detected, and has first to fourth input terminals. An output signal comp_hv_rst (see (B) of FIG. 7) of the comparator circuit 61 is input to the first input terminal. An output signal cnt_50 ms (see (C) of FIG. 7) of the counter circuit 63 is input to the second input terminal. An output signal comp_vi2v5 (not illustrated in FIG. 7, but see (D-2) of FIG. 5) of the comparator circuit 64 is input to the third input terminal. A power supply signal PWR_EN is input to the fourth input terminal. The FSM circuit 66 transitions the state based on the output signal comp_hv_rst, the output signal cnt_50 ms, and the output signal comp_vi2v5, which are input to the first to third input terminals, respectively, and outputs an output signal HV_RST depending on the state. In FIG. 7, (D-1) illustrates an example of the state transition of the FSM circuit 66. In (D-1) of FIG. 7, the FSM circuit 66 transitions to a reset state in a period in which an H signal is input as the output signal comp_vi2v5 to the third input terminal immediately after an H signal (a single pulse) is input as the output signal cnt_50 ms to the second input terminal. Note that the FSM circuit 66 is in a non-reset state (Other state) other than the reset state. The reset state of the FSM circuit 66 corresponds to the state in which the D flip-flop circuit 46 in FIG. 4 outputs an H signal as the output signal hv_rst_msk_x (see (D-1) of FIG. 5). In the reset state, the FSM circuit 66 outputs an L signal as the output signal HV_RST during a period in which an H signal is input as the output signal comp_vi2v5 (see (E) of FIG. 7).

As a result, the AND circuit 67 outputs an H signal as the output signal RST in response to an input of an H signal as the output signal HV_RST to the second input terminal. The AND circuit 67 outputs the L signal as the output signal RST in response to an input of an L signal as the output signal HV_RST to the second input terminal (see (E) of FIG. 7). Specifically, immediately after 50 ms has passed since the voltage of the terminal signal VIN became the voltage signal VCHG_OVL or higher and accordingly, an H signal (a single pulse) is output as the output signal cnt_50 ms, the AND circuit 67 outputs an L signal as the output signal RST. After that, when the terminal signal VIN becomes the voltage signal VCHG_OVL or lower and the output signal HV_RST changes from an L signal to an H signal, the AND circuit 67 outputs an H signal as the output signal RST.

The output signal RST output from the AND circuit 67 is applied as an internal reset signal to each circuit in the first domain of the reset circuit 21 (each circuit other than those in the second domain D2) and to the circuits other than the reset circuit 21 in the information processing device 11. Specifically, the output signal RST output from the AND circuit 67 is input to the third input terminal of the comparator circuit 61, and the comparator circuit 61 is reset when the output signal RST becomes an L signal. The output signal RST output from the AND circuit 67 is input to the second input terminal of the counter circuit 63 via the AND circuit 62, and the counter circuit 63 is reset when the output signal RST becomes an L signal.

According to the second embodiment of the reset circuit 21 described above, since the reset is performed after a certain period of time has elapsed from the point of time when the voltage of the terminal signal VIN was detected to be the voltage signal VCHG_OVL or higher, unintentional resets due to noise, surge pulses, and the like are prevented, and robustness is improved. Since the voltage value of the voltage signal VCHG_OVL and the voltage value of the comparison signal Ref can be changed, it is possible to cope with differences in charging voltage depending on the battery type. Since a domain to be reset is divided into two, and the circuits in the second domain D2 that includes a circuit for holding data indicating that the high-voltage reset signal Vreset has been detected (a circuit for holding the output of an H signal) and a circuit that detects whether or not the voltage of the terminal signal VIN input from the VIN terminal is the comparison voltage Ref or lower is not reset at the same time as the circuits in the first domain, the reset of the circuits in the first domain is properly performed. Rather than being reset by the high-voltage reset signal Vreset, the circuits in the second domain D2 can be reset at a different timing from that for the circuits in the first domain by, for example, changing the power supply signal PWR_EN to an L signal. The reset circuit 21 of FIG. 6, which is the second embodiment, can be configured by a digital circuit that processes voltage signals as digital values. However, the comparator circuit 64 may be an analog circuit operable as long as it does not require reset and can use a power supply.

Third Embodiment of Reset Circuit 21

Figure 8:
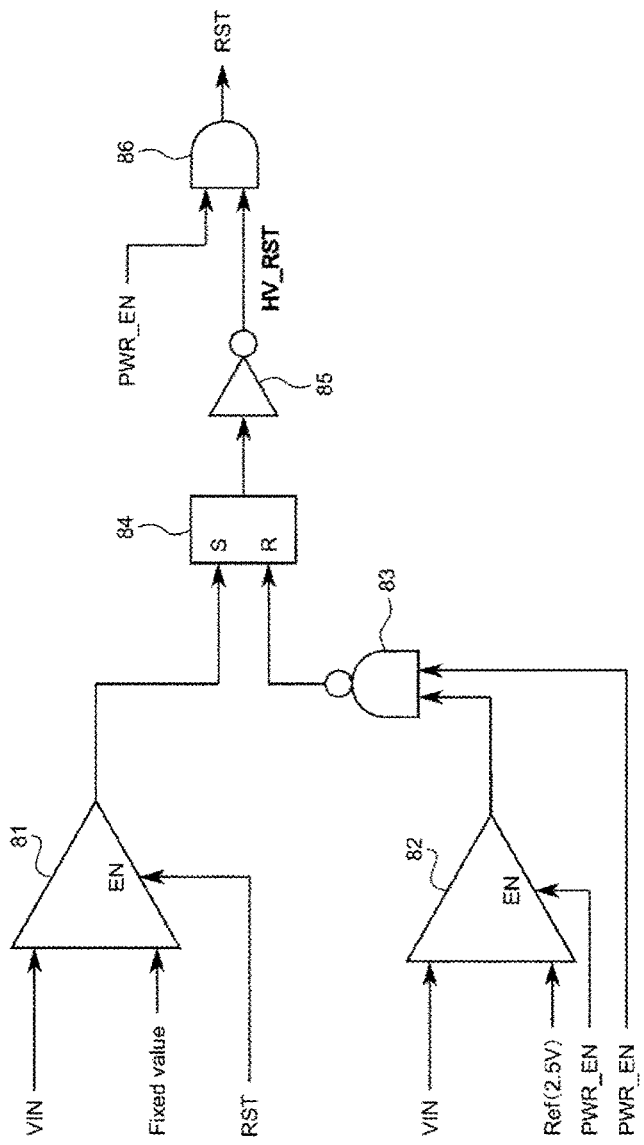
FIG. 8 is a block diagram illustrating a configuration of a third embodiment of the reset circuit of FIG. 1.
Figure 9:
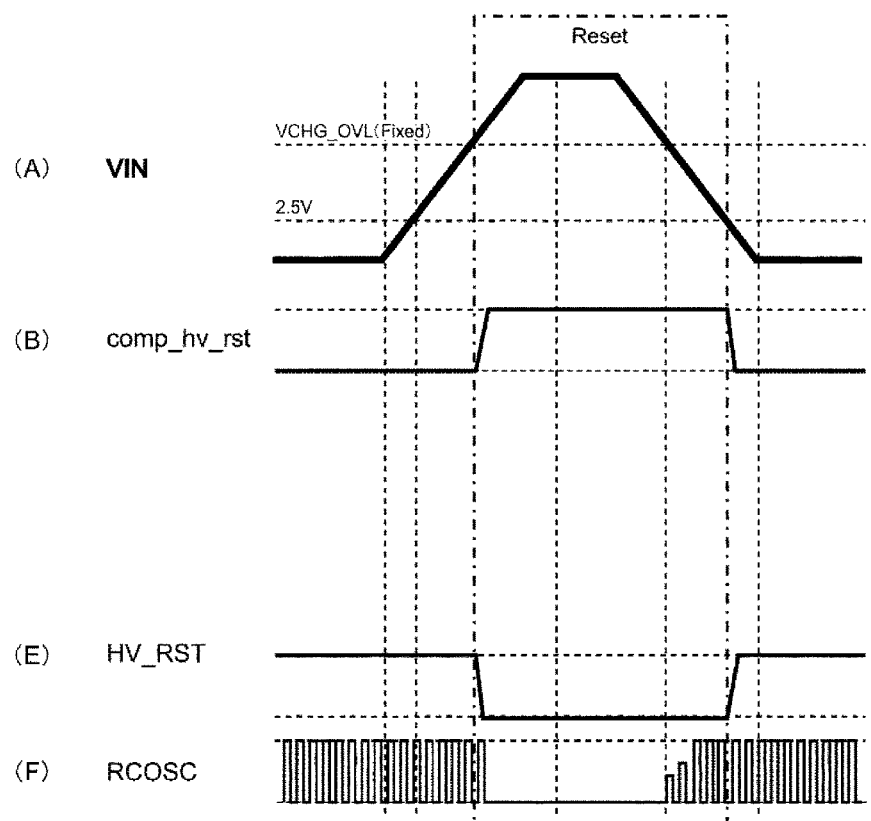
FIG. 9 is a diagram representing transitions of output signals of parts of the reset circuit of FIG. 8.

FIG. 8 is a block diagram illustrating a configuration of the third embodiment of the reset circuit 21 of FIG. 1. FIG. 9 is a diagram representing transitions of output signals of parts of the reset circuit 21 of FIG. 8. For explaining the reset circuit 21 of FIG. 8, reference will be made to FIG. 9 as appropriate. Note that the high-voltage reset signal Vreset is a signal in a voltage range of (voltage signal VCHG_OVL) V or higher and 6.0 V or lower.

In FIG. 8, the reset circuit 21 includes a comparator circuit 81, a comparator circuit 82, a NAND circuit 83, an RS flip-flop circuit 84, a NOT circuit 85, and an AND circuit 86. The comparator circuit 81, the comparator circuit 82, and the AND circuit 86 in the reset circuit 21 of FIG. 8 correspond to the comparator circuit 41, the comparator circuit 44, and the AND circuit 48 in FIG. 4, respectively, and thus, the detailed description thereof will be omitted. Note that in FIG. 8, the voltage of the voltage signal VCHG_OVL input to the second input terminal of the comparator circuit 81 is represented as a fixed value by Fixed value.

In FIG. 8, the NAND circuit 83 has a first input terminal and a second input terminal. A power supply signal PWR_EN that is the same as that in the first embodiment of FIG. 4 is input to the first input terminal. An output signal comp_vi2v5 output from the comparator circuit 82 is input to the second input terminal. The NAND circuit 83 outputs an L signal or an H signal according to a logical NAND (a logical NAND of positive logic with 1 for an H voltage and 0 for an L voltage) of the power supply signal PWR_EN input to the first input terminal and the output signal comp_vi2v5 input to the second input terminal. Specifically, the NAND circuit 83 outputs an L signal from the output terminal in response to an input of an H signal as the output signal comp_vi2v5 to the second input terminal. The NAND circuit 83 outputs an H signal in response to an input of an L signal as the output signal comp_vi2v5 to the second input terminal.

The RS flip-flop circuit 84 has an S terminal and an R terminal. The output signal of the comparator circuit 81 is input to the S terminal. The output signal of the NAND circuit 83 is input to the R terminal. The RS flip-flop circuit 84 outputs an L signal as the output signal comp_hv_rst in response to inputs of an H signal to the S terminal and an H signal to the R terminal. The RS flip-flop circuit 84 outputs an H signal as the output signal comp_hv_rst in response to inputs of an H signal to the S terminal and an L signal to the R terminal. The RS flip-flop circuit 84 outputs the voltage that has been output so far as the output signal comp_hv_rst in response to inputs of an L signal to the S terminal and an L signal to the R terminal. The RS flip-flop circuit 84 outputs an L signal as the output signal comp_hv_rst in response to inputs of an L signal to the S terminal and an H signal to the R terminal. In FIG. 9, (B) represents the transition of the output signal comp_hv_rst of the RS flip-flop circuit 84. In (B) of FIG. 9, when the voltage of the terminal signal VIN is lower than the comparison signal Ref (2.5 V), an L signal is input to the S terminal and an H signal is input to the R terminal, and accordingly, the RS flip-flop circuit 84 outputs an L signal as the output signal comp_hv_rst. After that, when the voltage of the terminal signal VIN is the comparison signal Ref (2.5 V) or higher and is lower than the voltage signal VCHG_OVL, an L signal is input to the S terminal and an L signal is input to the R terminal, and accordingly, the RS flip-flop circuit 84 outputs an L signal, which is the voltage so far, as the output signal comp_hv_rst. When the voltage of the terminal signal VIN becomes the voltage signal VCHG_OVL or higher, an H signal is input to the S terminal and an L signal is input to the R terminal, and accordingly, the RS flip-flop circuit 84 outputs an H signal as the output signal comp_hv_rst. After that, even when the voltage of the terminal signal VIN becomes lower than the voltage signal VCHG_OVL, an L signal is input to the S terminal and an L signal is input to the R terminal as long as it is the comparison signal Ref (2.5 V) or higher, and accordingly, the RS flip-flop circuit 84 outputs an H signal, which is the voltage so far, as the output signal comp_hv_rst. When the voltage of the terminal signal VIN becomes lower than the comparison signal Ref (2.5 V), an L signal is input to the S terminal and an H signal is input to the R terminal, and accordingly, the RS flip-flop circuit 84 outputs an L signal as the output signal comp_hv_rst.

The NOT circuit 85 changes the output signal of the RS flip-flop circuit 84 input to the input terminal from an L signal to an H signal, or vice versa, to outputs the resulting signal as the output signal HV_RST. In FIG. 9, (E) illustrates an example of the transition of the output signal HV_RST. In (E) of FIG. 9, the NOT circuit 85 outputs an L signal as the output signal HV_RST for the output signal comp_hv_rst being an H signal. The NOT circuit 85 outputs an H signal as the output signal HV_RST for the output signal comp_hv_rst being an L signal.

As a result, the AND circuit 86 outputs the power supply signal PWR_EN as it is as the output signal RST in response to an input of an H signal as the output signal HV_RST to the second input terminal. The AND circuit 86 outputs an L signal as the output signal RST in response to an input of an L signal as the output signal HV_RST to the second input terminal. In other words, the AND circuit 86 outputs an L signal as the output signal RST when the voltage of the terminal signal VIN becomes the voltage signal VCHG_OVL or higher. After that, when the terminal signal VIN becomes lower than the comparison signal Ref and the output signal HV_RST changes from an L signal to an H signal, the AND circuit 86 outputs an H signal as the output signal RST.

The output signal RST output from the AND circuit 86 is applied as an internal reset signal to each circuit in the first domain of the reset circuit 21 (each circuit other than the RS flip-flop circuit 84 and the NOT circuit 85, which are circuits in the second domain) and to the circuits other than the reset circuit 21 in the information processing device 11. Specifically, the output signal RST output from the AND circuit 86 is input to the third input terminal of the comparator circuit 81, and the comparator circuit 81 is reset when the output signal RST becomes an L signal.

According to the third embodiment of the reset circuit 21 described above, the reset is performed in a period from the point of time when the voltage of the terminal signal VIN is detected to be the voltage signal VCHG_OVL or higher to the point of time when the voltage of the terminal signal VIN is the comparison signal Ref or lower, which is a voltage lower than the voltage signal VCHG_OVL. Therefore, even if the voltage of the high-voltage reset signal Vreset is unstable, the reset is difficult to be canceled and has excellent robustness. Unnecessary operations for detecting a voltage after the cancellation of reset are also avoided. Note that the reset circuit 21 in FIG. 8 is an aspect in which only analog circuits operable as long as it does not require reset and can use a power supply is used to configure a circuit for holding data indicating that the high-voltage reset signal Vreset has been detected and a circuit that detects whether or not the voltage of the terminal signal VIN input from the VIN terminal is the comparison voltage Ref or lower. Therefore, there is no need to separate the circuit domain of the reset circuit 21 into a first domain and a second domain. However, the reset circuit 21 of FIG. 8 may be configured by a digital circuit, and in that case, the reset can be performed by setting the power supply signal PWR_EN to an L signal.

The present technique can be also configured as follows:

(1)

An information processing device including a reset processing unit that resets a built-in circuit in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage.

(2)

The information processing device according to (1), wherein the reset processing unit
resets the circuit from a third point of time when a predetermined time has passed from the first point of time.

(3)

The information processing device according to (1) or (2), wherein
for a first domain circuit and a second domain circuit into which the circuit is divided, the reset processing unit resets the first domain circuit in the period of the first point of time to the second point of time, and resets the second domain circuit from the second point of time.

4)
The information processing device according to (1) or (2), wherein
for a first domain circuit and a second domain circuit into which the circuit is divided, the reset processing unit resets the first domain circuit in the period of the first point of time to the second point of time, and resets the second domain circuit according to another reset signal different from the reset signal.

(5)
The information processing device according to (3) or (4), wherein
the second domain circuit includes a holding circuit for holding data indicating that the input signal is detected to be the reset signal, and
the reset processing unit resets the first domain circuit when the holding circuit holds the data.

(6)
The information processing device according to any one of (3) to (5), wherein the reset processing unit applies an internal reset signal to the first domain circuit to reset.

(7)
The information processing device according to any one of (3) to (6), wherein the reset processing unit
stops resetting the first domain circuit at the second point of time.

(8)
The information processing device according to any one of (1) to (7), wherein the reset processing unit
changes the first voltage.

(9)
The information processing device according to any one of (1) to (8), wherein the reset processing unit
changes the second voltage.

(10)
The information processing device according to any one of (1) to (9), wherein the signal of a different type from the reset signal includes a charging signal for charging a built-in battery.

(11)
The information processing device according to (10), wherein the first voltage is greater than a voltage range of the charging signal.

(12)
The information processing device according to (10) or (11), wherein the second voltage is smaller than a voltage range of the charging signal.

(13)
The information processing device according to any one of (1) to (12), wherein the signal of a different type from the reset signal includes a communication signal for communication.

(14)
The information processing device according to (13), wherein the first voltage is greater than a voltage range of the communication signal.

15)
An information processing method including resetting, by a reset processing unit of an information processing device including
the reset processing unit,
a built-in circuit in a period of a first point of time to a second point of time, wherein an input signal input from a common input terminal into which a reset signal for instructing reset of the circuit and a signal of a different type from the reset signal are input is detected at the first point of time to have a first voltage or higher at which the input signal is determined to be the reset signal, and the reset signal is detected at the second point of time to have a second voltage or lower that is lower than the first voltage.

REFERENCE SIGNS LIST

11 Information processing device
21 Reset circuit
22 Charging circuit
23 Communication circuit
41, 44 Comparator circuit
42, 45, 48 AND circuit
43 Counter circuit
46 D flip-flop circuit

The invention claimed is:

1. An information processing device comprising:
a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein
the reset circuit resets the built-in circuit from a third point of time when a predetermined time has passed from the first point of time.

2. The information processing device according to claim 1, wherein the input signal includes a communication signal for communication.

3. The information processing device according to claim 2, wherein the first voltage is greater than a voltage range of the communication signal.

4. An information processing device comprising:
a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein
for a first domain circuit and a second domain circuit into which the built-in circuit is divided, the reset circuit resets the first domain circuit in the period of the first point of time to the second point of time, and resets the second domain circuit from the second point of time.

5. The information processing device according to claim 4, wherein the second domain circuit includes a holding circuit for holding data indicating that the input signal is detected to be the reset signal, and the reset circuit resets the first domain circuit when the holding circuit holds the data.

6. The information processing device according to claim 4, wherein the reset circuit applies an internal reset signal to the first domain circuit to reset.

7. The information processing device according to claim 4, wherein the reset circuit stops resetting the first domain circuit at the second point of time.

8. An information processing device comprising:

a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein for a first domain circuit and a second domain circuit into which the built-in circuit is divided, the reset circuit resets the first domain circuit in the period of the first point of time to the second point of time, and resets the second domain circuit according to another reset signal different from the reset signal.

9. An information processing device comprising:

a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein the reset circuit changes the first voltage.

10. An information processing device comprising:

a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein the reset circuit changes the second voltage.

11. An information processing device comprising:

a reset circuit that resets a built-in circuit in a period of a first point of time to a second point of time, wherein an input signal input from a common input terminal into which a reset signal for instructing reset of the built-in circuit and an input signal of a different type from the reset signal are input is detected at the first point of time to have a first voltage or higher at which the input signal is determined to be the reset signal, and the reset signal is detected at the second point of time to have a second voltage or lower that is lower than the first voltage, wherein the input signal includes a charging signal for charging a built-in battery.

12. The information processing device according to claim 11, wherein the first voltage is greater than a voltage range of the charging signal.

13. The information processing device according to claim 11, wherein the second voltage is smaller than a voltage range of the charging signal.

* * * * *